(12) United States Patent
Crippa et al.

(10) Patent No.: US 11,029,337 B2
(45) Date of Patent: Jun. 8, 2021

(54) VERTICAL PROBE TESTING HEAD WITH IMPROVED FREQUENCY PROPERTIES

(71) Applicant: TECHNOPROBE S.P.A., Cernusco Lombardone (IT)

(72) Inventors: Roberto Crippa, Cernusco Lombardone (IT); Raffaele Vallauri, Cernusco Lombardone (IT)

(73) Assignee: TECHNOPROBE S.P.A., Cernusco Lombardone (IT)

( * ) Notice: Subject to any disclaimer, the term of this patent is extended or adjusted under 35 U.S.C. 154(b) by 108 days.

(21) Appl. No.: 16/550,089

(22) Filed: Aug. 23, 2019

(65) Prior Publication Data

US 2019/0377006 A1     Dec. 12, 2019

Related U.S. Application Data

(63) Continuation-in-part of application No. PCT/EP2018/054351, filed on Feb. 22, 2018.

(30) Foreign Application Priority Data

Feb. 24, 2017  (IT) .......................... 102017000021400

(51) Int. Cl.
  *G01R 1/073*    (2006.01)
  *G01R 1/04*     (2006.01)
  *G01R 3/00*     (2006.01)

(52) U.S. Cl.
  CPC ....... *G01R 1/07371* (2013.01); *G01R 1/0483* (2013.01); *G01R 1/07314* (2013.01); *G01R 1/07357* (2013.01); *G01R 3/00* (2013.01)

(58) Field of Classification Search
  CPC ............ G01R 1/07371; G01R 1/07314; G01R 1/07357; G01R 1/0483; G01R 3/00
  See application file for complete search history.

(56) References Cited

U.S. PATENT DOCUMENTS

| 6,297,657 B1 | 10/2001 | Thiessen et al. |
| 2004/0051546 A1* | 3/2004 | Thiessen ................. G01R 3/00 324/755.11 |
| 2012/0242360 A1 | 9/2012 | Huang et al. |
| 2014/0197860 A1 | 7/2014 | Hsu et al. |

(Continued)

FOREIGN PATENT DOCUMENTS

| KR | 10-1421051 B1 | 7/2014 |
| WO | 2012/106220 A1 | 8/2012 |
| WO | 2013/147417 A1 | 10/2013 |

*Primary Examiner* — Paresh Patel
(74) *Attorney, Agent, or Firm* — Seed Intellectual Property Law Group LLP

(57) ABSTRACT

A testing head comprises at least one guide provided with a plurality of guide holes, and a plurality of contact elements housed in the plurality of guide holes. Suitably, the at least one guide comprises a plurality of conductive layers, each conductive layer: including holes of a corresponding plurality of group of the plurality of guide holes and electrically connecting a corresponding group of contact elements housed in the guide holes of the group, contact elements of a group being adapted to carry a same type of signal. The at least one guide is a multilayer comprising a plurality of non-conductive layers, and the conductive layers are arranged on respective faces of a layer of the plurality of non-conductive layers.

28 Claims, 12 Drawing Sheets

(56) References Cited

U.S. PATENT DOCUMENTS

2015/0198632 A1\* 7/2015 Kim ................... G01R 1/07371
  324/750.25
2015/0301083 A1\* 10/2015 Kimura ................... G01R 1/18
  324/750.25

\* cited by examiner

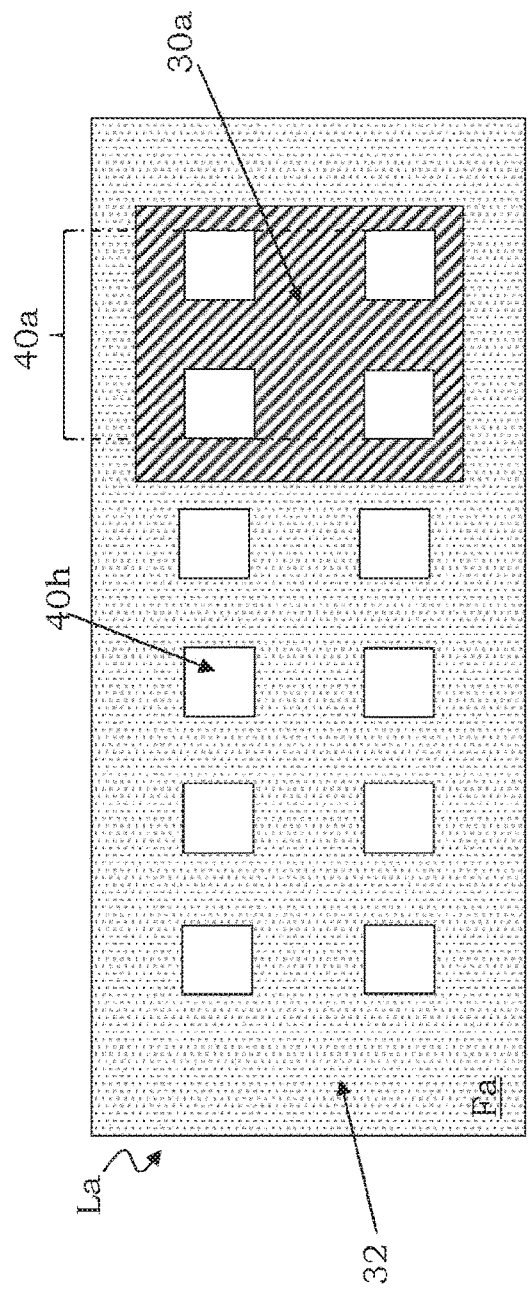
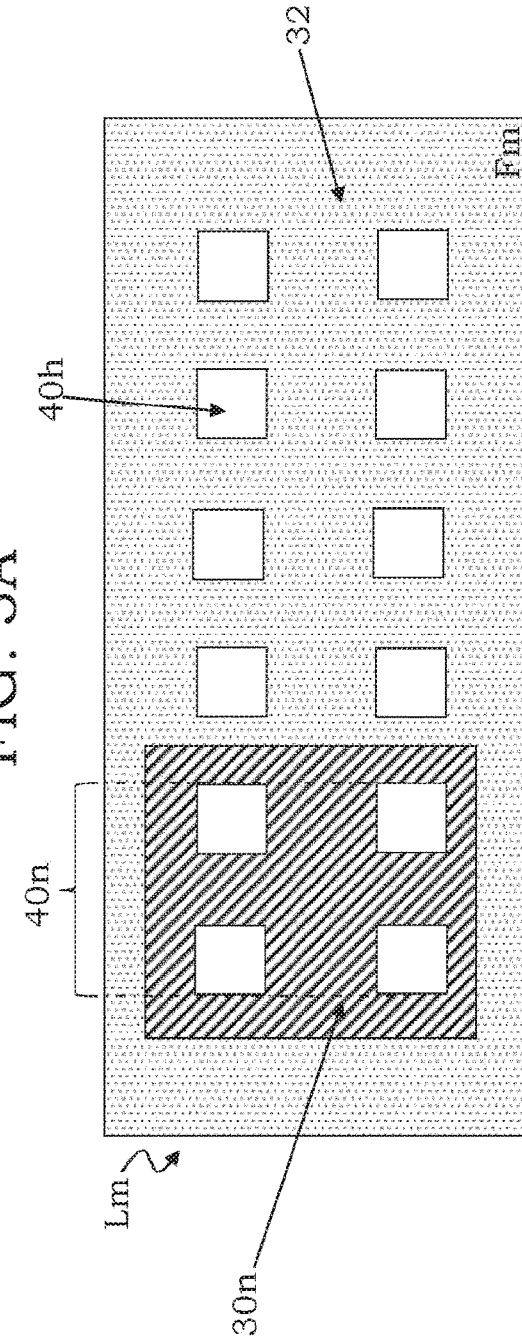
FIG. 3A
FIG. 3B

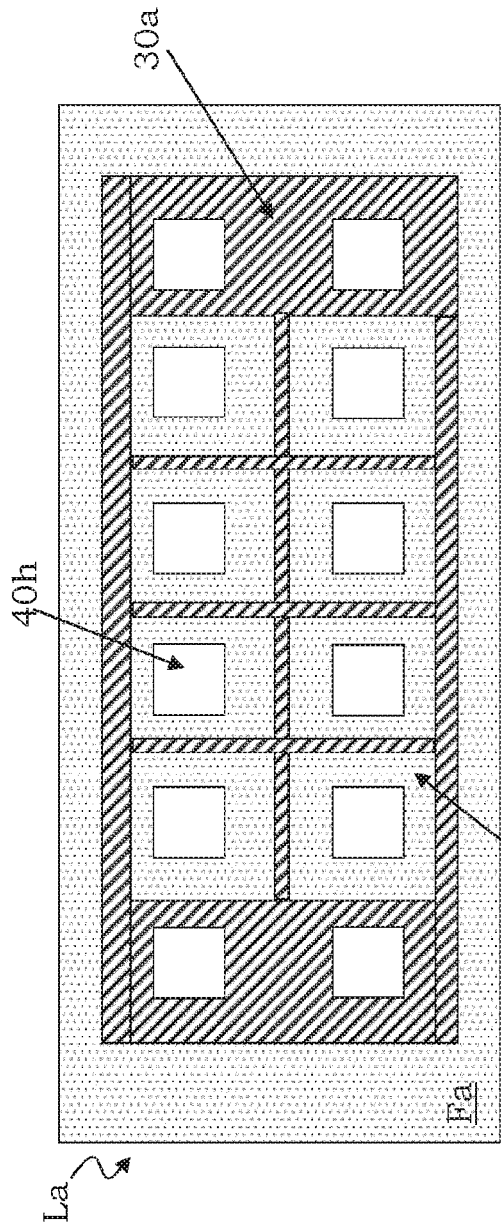
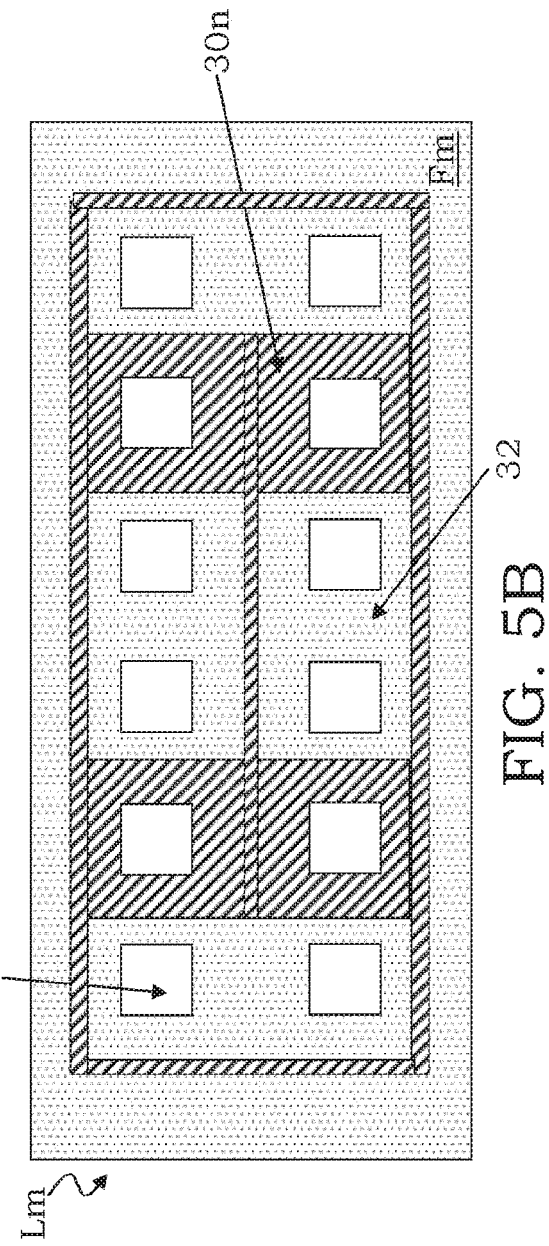
FIG. 5A
FIG. 5B

VERTICAL PROBE TESTING HEAD WITH IMPROVED FREQUENCY PROPERTIES

BACKGROUND

Technical Field

The present disclosure refers to a testing head for testing electronic devices that are integrated on a semiconductor substrate. More specifically, the present disclosure refers to a testing head comprising at least one guide provided with a plurality of guide holes adapted to house a plurality of contact elements and the following disclosure is made referring to this field of application with the sole aim of simplifying the presentation thereof.

Description of the Related Art

As it is well known, a testing head or probe head is an electronic device adapted to electrically connect a plurality of contact pads of a microstructure, such as a device that is integrated on a semiconductor wafer, with corresponding channels of a testing apparatus that performs the functionality testing thereof, in particular the electric testing, or the test, generically.

The test, which is performed on integrated devices, is particularly useful in detecting and isolating defective devices as early as in the production phase. Normally the testing heads are therefore employed for the electric test of devices that are integrated on wafers before cutting and assembling them inside a containment package.

Generally, a testing head comprises a plurality of contact elements or contact probes retained by at least one guide or by at least one pair of guides (or supports) that are substantially plate-shaped and parallel to each other. Said guides are provided with suitable guide holes and are arranged at a certain distance from each other in order to leave a free space or air gap for the movement and possible deformation of the contact probes, which are slidingly housed in said guide holes. The pair of guides comprises in particular an upper guide and a lower guide, the lower guide being the closest one to the device under test, both guides being provided with guide holes within which the contact probes axially slide, which are usually made of wires of special alloys having good electric and mechanical properties.

Good connection between the contact probes and the contact pads of the device under test is ensured by the pressure of the testing head on the device itself, the contact probes undergoing, during said pressing contact, a bending inside the air gap between the guides and a sliding inside the respective guide holes. Testing heads of this type are commonly called "testing heads with vertical probes" and indicated with the English term "vertical probe head".

Substantially, the vertical probe heads have an air gap wherein a bending of the contact probes occurs, said bending can be facilitated by a suitable configuration of the probes themselves or of the guides thereof, as schematically illustrated in FIG. 1.

In particular, FIG. 1 schematically illustrates a testing head 1 comprising at least one upper guide 2, usually indicated as "upper die", and a lower guide 3, usually indicated as "lower die", separated by an air gap 13, having respective guide holes 4 and 5 within which a plurality of contact probes 6 slides, just one probe of the plurality of contact probes being shown in FIG. 1 for the sake of simplicity.

Each contact probe 6 ends at an end with a contact tip 7 intended to abut onto a contact pad 8 of a device under test that is integrated on a wafer 9, so as to realize the mechanical and electric contact between said device under test and a testing apparatus (not shown), of which said testing head forms an end element.

Here and in the following the term "contact tip" indicates an end zone or region of a contact probe intended to contact a contact pad of the device under test, said end zone or region not being necessarily sharpened.

In some cases, the contact probes are fixedly fastened to the testing head at the upper plate-shaped support: such testing heads are referred to as "blocked testing heads".

More frequently, however, testing heads are used having not fixedly fastened blocked probes, but held interfaced to a so-called board, possibly through a microcontact board, provided with a plurality of contact pads: such testing heads are referred to as "not blocked testing heads". The microcontact board is usually called "space transformer" since, besides contacting the probes, also allows spatially redistributing the contact pads realized thereon with respect to the contact pads on the device under test, in particular relaxing the distance constraints between the centers of the pads themselves.

In this case, as illustrated in FIG. 1, each contact probe 6 has a further end area or region ending with a so-called contact head 11 towards a contact pad 11 of a plurality of contact pads of a space transformer 12. Good electric connection between contact probes 6 and space transformer 12 is ensured by pressing-abutting the contact heads 10 of the contact probes 6 onto the contact pads 11 of the space transformer 12 analogously to the contact between the contact tips 7 with the contact pads 8 of the device under test which is integrated on the wafer 9.

Generally, inside a testing head, the contact elements are divided into contact elements intended to carry power and ground signals towards the device under test and into contact elements intended to carry operating signals, in particular in/out signals, between the testing apparatus and the device under test.

In a testing head of the above described type, the presence of numerous contact elements intended to carry ground signals, as well as the presence of contact elements intended to carry power signals, is well known to generate interference, thus causing noise in the operating signals, namely in/out signals, used for testing the device under test, which limits the frequency performance of the testing head. In case of contact elements intended to carry ground signals, also disadvantageous ground loops may occur. The need to short-circuit two or more contact pads of the device under test is also known. According to a known solution, called look-back in the field, it is possible to short-circuit two contact pads of the device under test by means of two contact probes of the testing head, wherein a first probe carries a signal from a first pad of the device under test towards the testing apparatus and from the latter the signal is closed onto a second pad of the device under test by means of a second contact probe that contacts said second pad. However, in this case, the distance traveled by the signal from the device under test up to the testing apparatus and vice versa causes a reduction in the frequency performance of the testing head as a whole.

Conductive structures adapted to electrically connect different contact probes are disclosed for example in US 2012/0242360 A1, KR 101 421 051 B1, US 2014/0197860 A1, and WO 2012/106220 A1.

The desire to improve the frequency performance of a testing head is strongly felt in the field.

Therefore, the technical problem of the present disclosure is to conceive a testing head for testing electronic devices, having structural and functional features such as to allow overcoming the limitations and drawbacks which still nowadays affect the testing heads made according to the prior art, in particular capable of reducing, if not eliminating, in a simple way the interference and therefore the noise due to the presence of the ground and power contact elements, even in the case of several different power supplies, as well as capable of allowing the electric connection between contact pads of a device under test without reducing the frequency performance of the testing head itself.

BRIEF SUMMARY

The solution idea underlying the present disclosure is to provide a testing head wherein at least one guide is provided with guide holes and contact elements hosed therein, contact elements being intended to carry operating signals, namely in/out signals, between a testing apparatus and a device under test, being indicated as in/out contact elements, as well as contact elements intended to carry ground and power signals, being indicated as ground and power contact elements, a plurality of conductive layers formed in the guide electrically connecting at least one group of said ground contact elements and/or of said power contact elements and/or of said in/out contact elements housed in a corresponding group of guide holes, each layer of the plurality of conductive layers forming a common conductive plane for the corresponding group of contact elements.

Based on this solution idea, the above technical problem is primarily solved by a testing head adapted to verify the working of a device under test that is integrated on a semiconductor wafer, said testing head comprising at least one guide provided with a plurality of guide holes and a plurality of contact elements housed in said plurality of guide holes, said testing head being characterized in that the at least one guide comprises a plurality of conductive layers, each of said conductive layers including the holes of a respective group of guide holes and electrically connecting a corresponding group of contact elements housed in the group of guide holes, wherein contact elements of each respective group are adapted to carry a same type of signal.

More particularly, the disclosure comprises the following additional and optional features, taken singularly or in combination if necessary.

According to an aspect of the present disclosure, the at least one guide can be a multilayer comprising a plurality of non-conductive layers, at least one conductive layer of said plurality of conductive layers being arranged on at least one of said non-conductive layers of the guide.

In particular, the at least one guide can be preferably a ceramic multilayer comprising a plurality of non-conductive layers made of a ceramic material.

Alternatively, the at least one guide can comprise an organic multilayer associated with a rigid support, said organic multilayer including a plurality of layers made of an organic material that form non-conductive layers on which at least one respective conductive layer of said plurality of conductive layers is arranged.

Each of the conductive layers can be arranged on a face of a respective non-conductive layer of said at least one guide, the conductive layer including the holes of the respective group of guide holes and electrically connecting contact elements housed therein, the conductive layers having a lower area than an area of said face.

Alternatively, each of said conductive layers can cover a face of a respective non-conductive layer of said at least one guide, including the holes of the respective group of guide holes and electrically connecting contact elements housed therein, except contact elements housed in guide holes not belonging to said group.

According to an aspect of the present disclosure, the conductive layers can also comprise surface layers made on at least one exposed face of the at least one guide.

Alternatively, the plurality of conductive layers can be embedded in the at least one guide.

According to an aspect of the present disclosure, the testing head can comprise at least one first conductive layer and at least one second conductive layer, said first conductive layer including the holes of a first group of guide holes and electrically connecting a first group of contact elements housed in this group of guide holes, the first group of contact elements being adapted to carry ground signals, the second conductive layer including the holes of a second group of guide holes and electrically connecting a second group of contact elements housed in this second group of guide holes, the second group of contact elements being adapted to carry power signals.

In particular, the testing head can comprise a plurality of first conductive layers, the number of which corresponds to the number of power signals to carry and/or can comprise a plurality of second conductive layers, the number of which corresponds to the number of ground signals to carry.

Furthermore, the testing head can comprise at least a third conductive layer that includes the holes of a third group of guide holes and electrically connects a third group of contact elements housed in this third group of guide holes, the third group of contact elements being adapted to carry operating signals for the device under test.

In particular, the testing head can comprise a plurality of third conductive layers, the number of which corresponds to the number of groups of contact pads of the device under test to be short-circuited.

According to an aspect of the present disclosure, at least one of the conductive layers can be separated from other conductive layers and/or can be locally interrupted by at least one non-conductive zone so as not to allow the electrical connection between contact elements intended to carry different signals and/or contact elements that must not be short-circuited.

In this regard, it is pointed out that the at least one guide can comprise at least one coating dielectric portion that covers said at least one non-conductive zone.

Furthermore, the testing head can comprise at least one lower guide, at least one intermediate guide and at least one upper guide, the lower guide and the intermediate guide being separated from each other by a first air gap and the intermediate guide and the upper guide being separated from each other by a second air gap, each of the guides comprising respective holes for housing the contact elements.

It should also be pointed out that the lower guide and/or the intermediate guide and/or the upper guide can comprise the plurality of conductive layers, preferably the lower guide.

According to an aspect of the present disclosure, each layer of the plurality of conductive layers can cover at least one portion of an inner surface of each guide hole of said group of guide holes.

Alternatively, at least one portion of a wall of all of the guide holes of the at least one guide can comprise a metallization.

According to an aspect of the present disclosure, the at least one guide can comprise at least one conductive track connected to a conductive layer of the plurality of conductive layers for extracting the signal carried by the contact elements that are electrically connected by said conductive layer.

According to another aspect of the present disclosure, the at least one guide comprises a portion that is recessed in correspondence of at least one guide hole.

Still according to another aspect of the present disclosure, the testing head can further comprise at least one electronic component, preferably a capacitor, electrically connected to at least one layer of the plurality of conductive layers of the at least one guide.

Finally, the at least one guide can comprise at least one conductive portion that includes one of the guide holes intended to house a single contact element, said at least one guide comprising a conductive track that extracts the signal from said at least one conductive portion and/or connects at least one conductive portion to further conductive portions or to a layer of the plurality of conductive layers.

The characteristics and advantages of the testing head according to the disclosure will be apparent from the description, made hereafter, of an embodiment thereof, given by indicative and non-limiting example, with reference to the accompanying drawings.

BRIEF DESCRIPTION OF THE SEVERAL VIEWS OF THE DRAWINGS

FIGS. 5A and 5B schematically show a view from above of layers of a guide of the testing head of FIG. 4;

DETAILED DESCRIPTION

Figure 1:
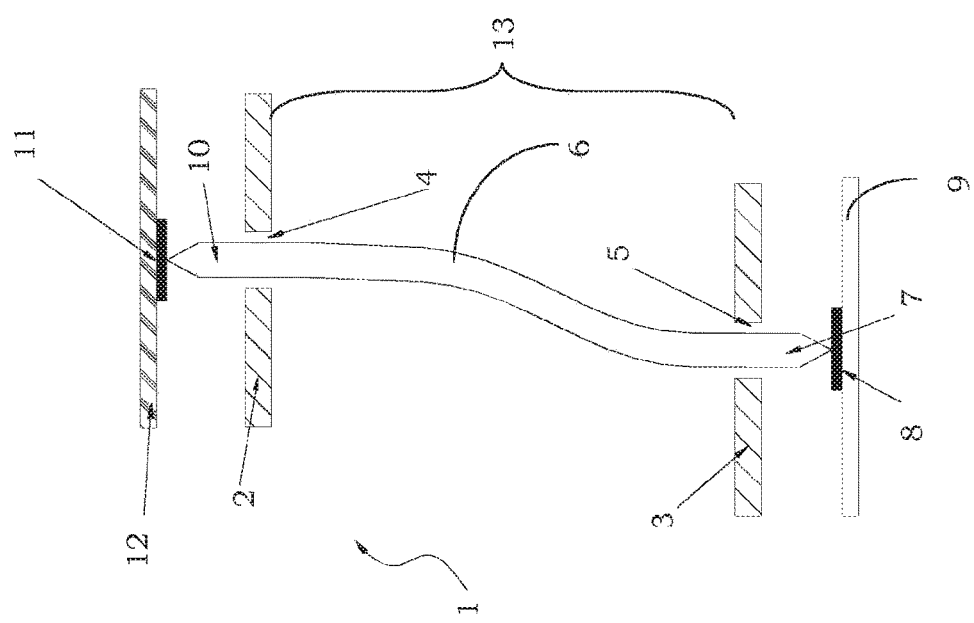
FIG. 1 schematically shows a testing head made according to the prior art.
Figure 2:
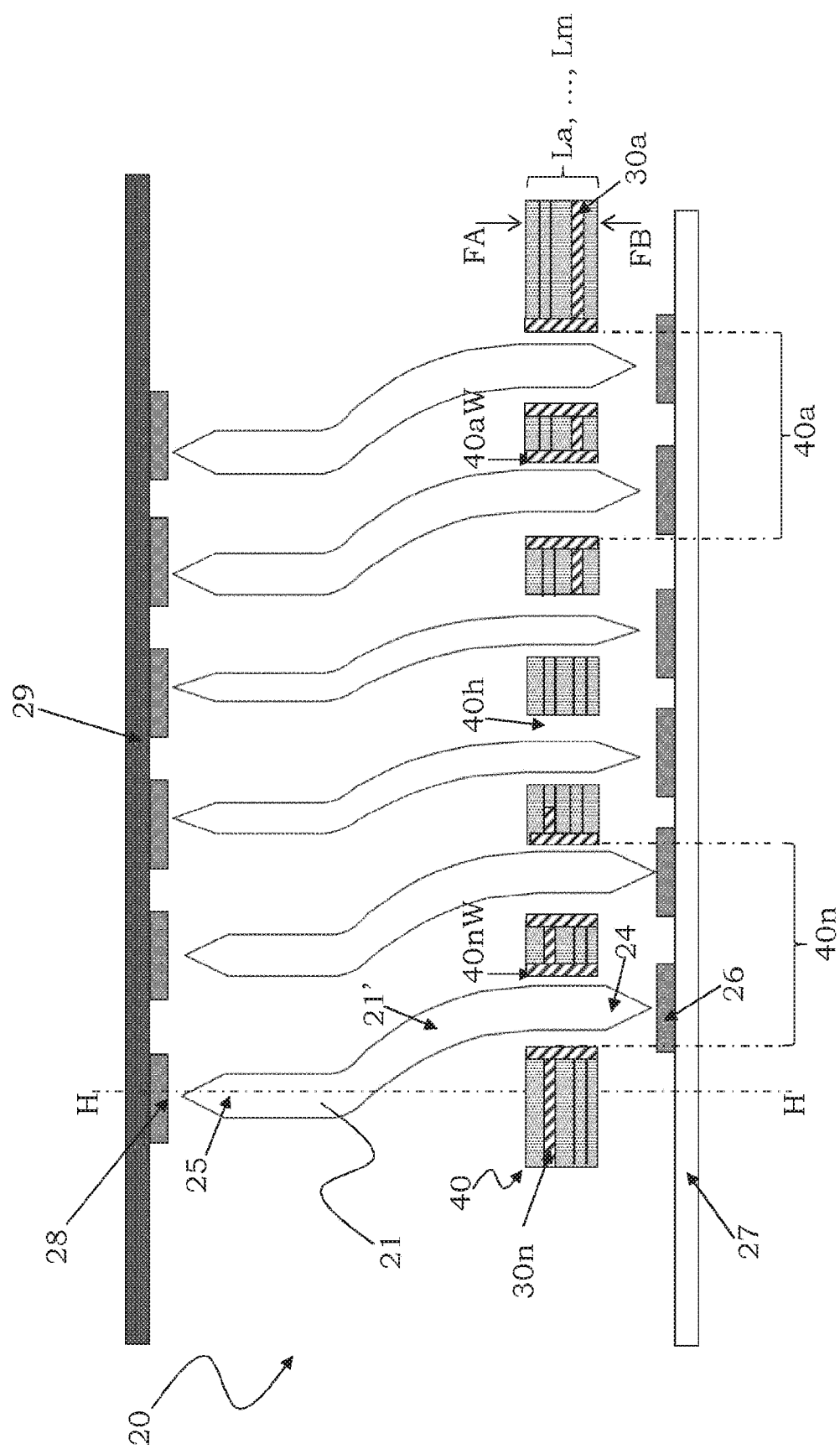
FIG. 2 schematically shows a testing head made according to the present disclosure.

With reference to said figures, and in particular to FIG. 2, reference number 20 globally and schematically indicates a testing head for testing electronic devices that are integrated on a semiconductor wafer made according to the present disclosure.

It is worth noticing that the figures represent schematic views and are not drawn to scale, but instead they are drawn so as to enhance the important features of the disclosure.

Furthermore, in the figures, the different elements are schematically shown, and their shape can vary according to the desired application. It is also worth noticing that in the figures identical reference numbers refer to elements identical in shape or function. Finally, particular features described in relation to an embodiment illustrated in a figure can also be used for the other embodiments illustrated in the other figures.

As illustrated in FIG. 2, the testing head 20 comprises at least one guide 40, in the example of the figure a lower guide, provided with a plurality of guide holes 40*h* adapted to house a plurality of contact elements 21.

Generally, the testing head 20 is used to verify the working of a device under test that comprises at least one first region intended to receive power and ground signals, and a second region intended to receive/send operating signals, namely in/out signals from/towards a testing apparatus (not shown) that is connected to said testing head 20. In the first region power signals having high current values, usually of the order of 1 A or more, as well as ground signals, are processed, whereas in the second region operating signals, namely in/out signals having lower current values, usually of the order of 0.5 A or less, are processed. For this reason, in the testing head 20 the contact elements intended to carry power and ground signals and the contact elements intended to carry in/out signals towards/from a device under test are distinct from each other also having different physical and mechanical features, in particular for the materials used to make them, as well as the section available for the passage of current.

In the example of FIG. 2 six contact elements are shown, but the number of said contact elements can obviously vary according to the needs and/or circumstances, the Figures being provided just by way of non-limiting example of the present disclosure.

Furthermore, still by way of non-limiting example of the disclosure, FIG. 2 shows a testing head 20 in which the contact elements are shaped as contact probes, preferably made of metal wires, having a body 21' that has a pre-deformation and that is adapted to further deform when it press-contacts the contact pads of a device under test, said contact probes being housed in the guide holes 40*h*, which are formed in the sole guide 40, but the disclosure is not limited to this since the testing head 20 can comprise both a lower guide, an intermediate guide and an upper guide, as well as a different type of contact elements, as it will be shown in detail in the following.

Each contact element 21 of the testing head 20 thus comprises the body 21', which extends along a longitudinal axis H-H between a first end portion or contact tip 24 and a second end portion or contact head 25.

More particularly, the contact tip 24 is adapted to abut onto corresponding pads or contact pads 26 of a device under test that is integrated on a semiconductor wafer 27.

Furthermore, in the example shown, the testing head 20 is of the type with not blocked probes and the contact elements end with the contact head 25 that is adapted to abut onto corresponding pads or contact pads 28 of an interposer or space transformer 29.

In particular, the space transformer 29 is adapted to realize a spatial transformation of the distances between the centers or pitches of the contact pads formed on opposite faces thereof, said space transformer 29 being generally connected to a printed circuit board or PCB (not shown), which in turn interfaces with the testing device (also not shown).

Suitably, the guide 40 is preferably a ceramic multilayer (MLC, acronym from English "Multi-Layer Ceramic") comprising a plurality of non-conductive m layers La-Lm, in particular made of a ceramic material. The guide 40 is thus made by means of a based-ceramic technology in which different layers are arranged one upon the other, said multilayer having a thickness generally comprised between 100 µm and 3 mm and comprising a number of layers that varies from two up to twenty according to the needs and/or circumstances.

The guide holes 40h of the guide 40 are thus made by openings formed in each non-conductive layer La-Lm, said openings being concentrically overlapped and having the same diameter. It is pointed out that, in the present disclosure, the term diameter means a maximum transversal dimension.

The non-conductive layers La-Lm can also be made of a glassy material or of any other suitable dielectric material, as it will be shown in the following.

Advantageously according to the present disclosure, on some or on each of said non-conductive layers La-Lm of the guide 40 at least one conductive layer is arranged, so that the guide 40 comprises a plurality of conductive layers, indicated with reference number 30a-30n in the present description. Specifically, each of the conductive layers 30a-30n includes a respective group 40a-40n of the guide holes 40h and electrically connects a corresponding group of the contact elements 21 hosed therein. The contact elements of each respective group are adapted to carry a same type of signal, for instance a ground signal or a power signal or an operating signal, namely an in/out signal, between the device under test and the testing apparatus.

It is thus clear that each conductive layer is separated from the adjacent conductive layers by means of non-conductive layers, which are made by the non-conductive layers La-Lm of the guide 40.

According to the present disclosure, a first conductive layer 30a includes the guide holes of a first group 40a, a second conductive layer 30b includes the guide holes of a second group 40b, and, in general, an n-th conductive layer 30n includes the guide holes of an n-th group 40n, the number of the conductive layers may vary according to the needs and/or circumstances and may also be just one.

In this way, each conductive layer forms a common conductive plane, for instance a ground or power plane, but not limited to these, for the contact elements 21 that are housed in the guide holes of the respective group 40a-40n, said contact elements being thus electrically connected to each other by means of said common conductive plane.

It is pointed out that, in the present description, reference number 21 identifies all contact elements of the testing head 20, which can be intended to carry ground signals or intended to carry power signals or intended to carry operating signals, namely in/out signals between the device under test and the testing apparatus, as it will be detailed in the following.

By way of example, in FIG. 2 the conductive layer 30a can electrically connect contact elements dedicated to carry ground signals, whereas the conductive layer 30n can electrically connect contact elements intended to carry power signals, even if obviously said contact elements can be dedicated to carry any other type of signal. In the embodiment of FIG. 2, as previously described, the contact elements 21 of the testing head 20 are contact probes having the body 21' provided with a pre-deformation and adapted to further deform while contacting the contact pads 26 and 28 of the device under test 27 and of the space transformer 29, respectively. In this case, each conductive layer 30a-30n preferably also coats at least one portion 40aW-40nW of an inner surface of each guide hole of the respective group 40a-40n that is short-circuited by said conductive layer. Still more preferably, each conductive layer 30a-30n completely coats the inner surface of the guide holes of the respective group 40a-40n, the portion 40aW-40nW coinciding in this case with the entire inner surface of the holes. The electric connection between the contact probes 21 and the respective conductive layer is thus formed by a sliding contact between the body 21' of the probes and the conductive portion coating the inner surface portion 40aW-40nW of the guide holes wherein the probes are housed.

In any case it is pointed out that, even if the conductive layer does not coat the inner surface of the guide holes, the sliding contact is anyway ensured by the thickness of the conductive layer itself, which emerges at the inner walls of the guide hole to be short-circuited and is adapted to contact the contact probe that slides in said guide hole.

As illustrated in FIGS. 3A and 3B, each of the conductive layers 30a-30n is arranged on a face Fa-Fm of a respective non-conductive layer La-Lm of the guide 40 and has an area less than an area of said face Fa-Fm.

In particular, FIG. 3A shows a view from above of a non-conductive layer La, whereon the conductive layer 30a is formed, of the guide 40, whereas FIG. 3B shows a view from above of a non-conductive m-th layer Lm, whereon the conductive layer 30n is formed, of said guide 40. It is thus clear that each of the conductive layers 30a-30n only cover a respective surface portion of the respective non-conductive layer La-Lm of the guide 40, in particular a portion arranged so as to short-circuit the desired group of contact elements included in the desired group of holes (the group 40a in FIG. 3A and the group 40n in FIG. 3B), so that when the non-conductive layers La-Lm of the guide 40 are overlapped undesired electric connections do not generate. In other terms, each non-conductive layer La-Lm comprises a non-conductive zone 32 wherein guide holes are present, which house contact elements that should not be short-circuited.

In an alternative embodiment of the present disclosure not illustrated in the figures, each of the conductive layers 30a-30n covers a face Fa-Fm of a respective non-conductive layer La-Lm of the guide 40 except areas wherein guide holes are formed, which do not belong to the group of holes which house contact elements 21 that should be short-circuited by means of said conductive layer at said particular non-conductive layer of the guide, for instance those holes intended to house contact elements that carry a different type of signal, said areas without the conductive layer thus defining the non-conductive zones 32 of the guides analogously to what was described in the previous paragraph.

In any case, thanks to the presence of the non-conductive zones 32, it is also possible to metallize the walls of all guide holes 40h of the guide 40, said non-conductive zones 32 being such as to avoid the electric connection with contact elements that do not need to be short-circuited though in contact with said metallized walls.

In this regard, it is also possible to provide for the non-conductive zone 32 to be in turn covered by at least one additional portion of dielectric material or coating dielectric portion arranged on the layers La-Lm of the guide 40, so as to avoid the presence of grooves in the guide 40, for instance between different conductive layers on a same layer of the guide or at guide holes that should not be metallized, wherein metal debris produced by the sliding contact of the contact elements with the walls of the guide holes can be deposited. In other terms, the coating dielectric portion, which preferably has a thickness substantially identical to the one of the conductive layers, covers the non-conductive zones 32 thus preventing the metal debris from depositing, so as to avoid leakage and undesired electric connections between contact elements intended to carry a different type of signal.

It is furthermore underlined that, though FIGS. 2 and 3A-3B only show two conductive layers 30a and 30n, it is possible to provide any number of conductive layers according to the desired application, for instance according to the number of power signals to carry, each power domain being connected to a respective conductive layer.

The conductive layers 30a-30n may be embedded in the guide 40, thus forming a conductive multilayer inside the guide 40, even if the disclosure is not limited to this and there is the possibility to also make surface conductive layers, as it will be indicated later.

In this regard, it is possible for each non-conductive layer La-Lm of the guide 40 to comprise the respective conductive layer, or it is possible to provide for a configuration wherein not all non-conductive layers La-Lm of the guide 40 are coated by a respective conductive layer, as it is precisely the case of a plurality of embedded conductive layers, wherein at least one of the outermost non-conductive layers La-Lm of the guide 40 does not comprise a conductive layer.

Figure 3C:
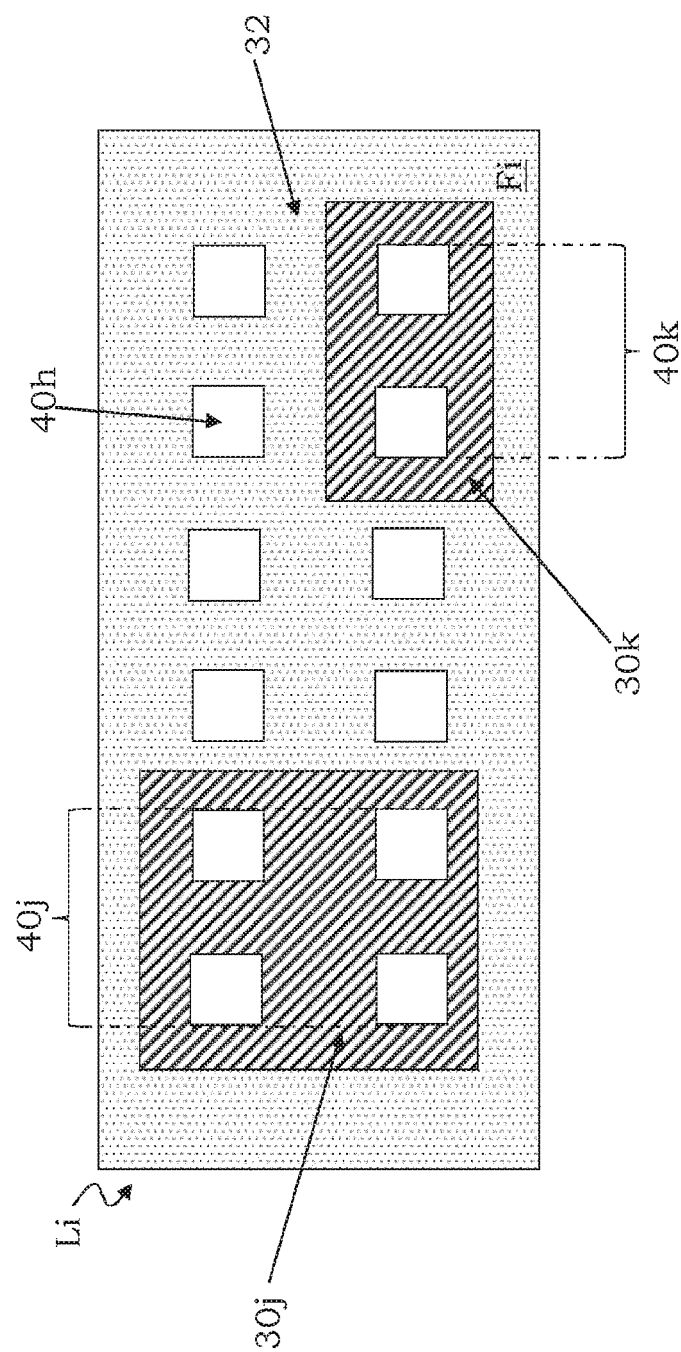
FIGS. 3A and 3B schematically show a view from above of layers of a guide of the testing head of FIG. 2, whereas FIG. 3C schematically shows a view from above of a layer of a guide according to an alternative embodiment of the present disclosure.

It is also possible to provide for a configuration in which more than one conductive layer is formed on a same non-conductive layer of the guide 40, as illustrated in FIG. 3C, wherein a layer Li of the guide 40 comprises a conductive layer 30j and another conductive layer 30k. In case both layers 30j and 30k electrically connect contact elements intended to carry a same type of signal, said conductive layers 30j and 30k can be possibly electrically connected to each other by means of a conductive track (not illustrated in FIG. 3C).

As a result, the number m of the non-conductive layers La-Lm of the guide 40 does not always correspond to the number n of conductive layers 30a-30n.

Figure 4:
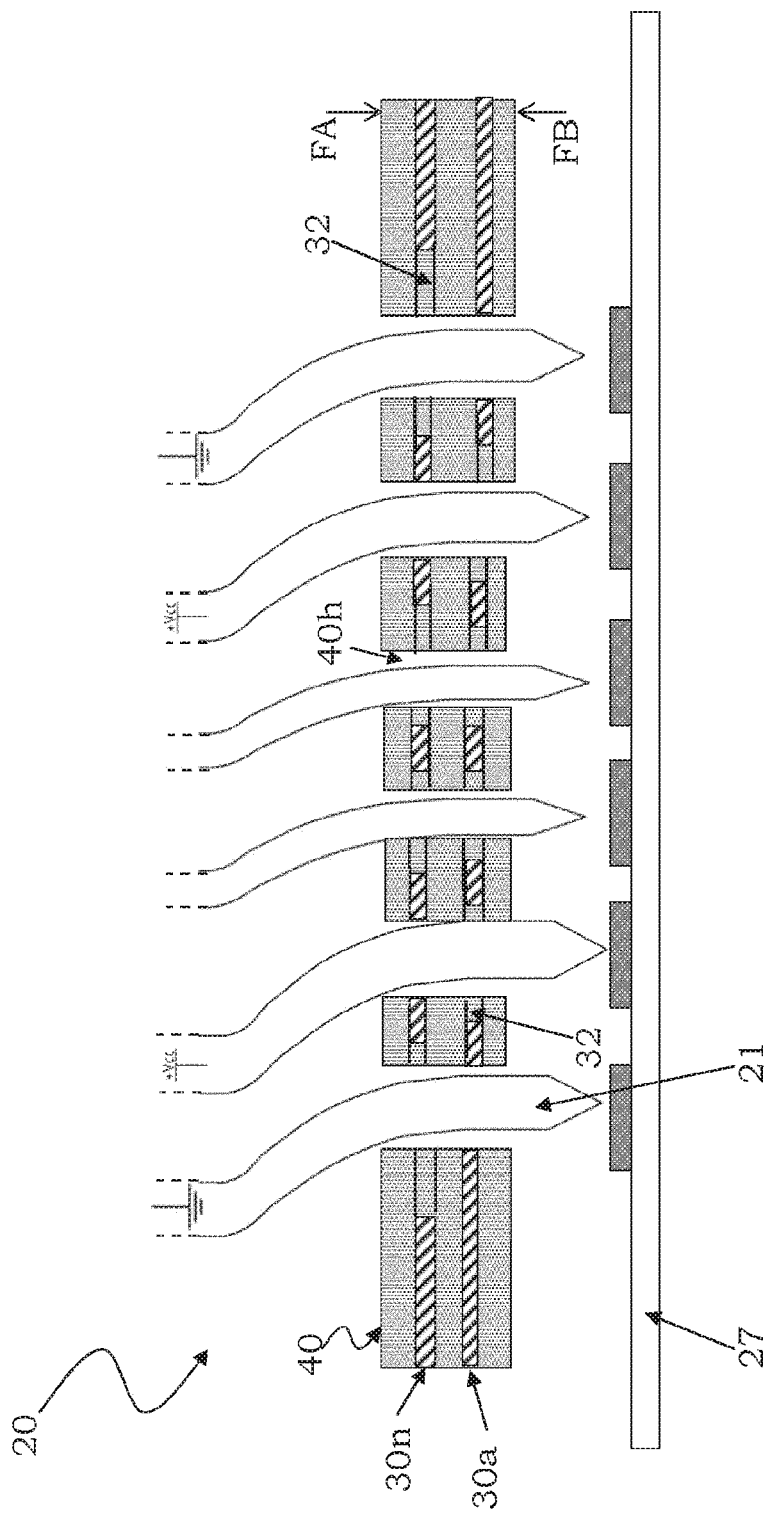
FIG. 4 schematically shows a portion of a testing head according to an alternative embodiment of the present disclosure.

Furthermore, the present disclosure allows greatly simplifying the production of the common conductive layers in case contact elements to be short-circuited, but intended to carry different signals, are very close to each other in the testing head 20, for instance in case they are alternated to each other, as illustrated in the example of FIG. 4.

In this case, each conductive layer is locally interrupted by the non-conductive zones 32, so as not to electrically connect contact elements intended to carry different signals, as also clearly visible in FIGS. 5A and 5B, which schematically show a view from above of two non-conductive layers of the guide illustrated in FIG. 4, which are provided with respective conductive layers. Therefore, the non-conductive zones 32, analogously to what has been pointed out in connection with FIGS. 3A and 3B, locally prevent the electric connection between adjacent contact elements intended to carry different signals.

As previously mentioned, in the case the testing head 20 should carry a plurality of different power signals, the guide 40 comprises a corresponding number of conductive layers, each conductive layer being adapted to electrically connect the respective contact elements intended to carry a single specific power signal, along with one or more conductive layers adapted to electrically connect contact elements intended to carry ground signals, as it will also be specified in the following.

In case it is necessary to electrically connect different contact pads of the device under test, the guide 40 also comprises conductive layers adapted to electrically connect contact elements intended to carry operating signals, namely in/out signals between the device under test and the testing device.

Figure 6:
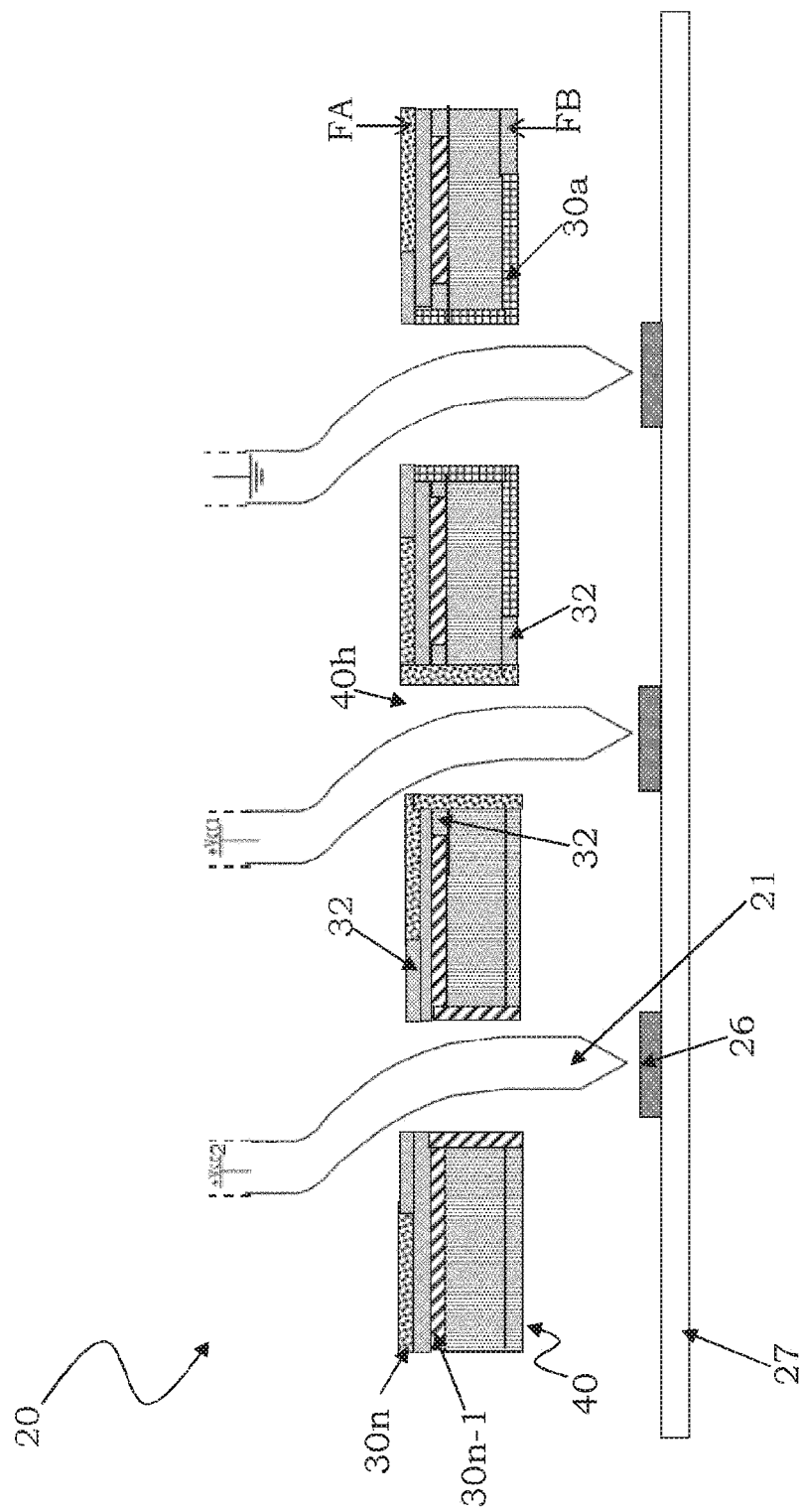
FIG. 6 schematically shows a portion of a testing head according to a further alternative embodiment of the present disclosure.

As previously mentioned and now shown in FIG. 6, the plurality of conductive layers 30a-30n also comprises surface layers formed on at least one exposed face of the guide 40. The expression "exposed face" indicates, here and in the following, the face of a non-conductive layer of the guide 40 that does not contact any other non-conductive layer of said guide 40. In this way, the guide 40 comprises both a plurality of conductive layers embedded therein and surface conductive layers.

In particular, a first conductive layer of the plurality of conductive layers is a surface layer formed on an exposed face FB of the guide 40, said face being a lower face according to the local reference of the figures, and a last conductive layer is also a surface layer formed on an opposite face FA of said guide 40, said face being an upper face according to the local reference of the figures.

Furthermore, still with reference to FIG. 6, an example is shown in which the testing head 20 carries two different power signals, Vcc1 and Vcc2. In this case, a layer 30n (formed on the exposed face FA of the guide 40) forms a conductive plane for the power domain Vcc1, whereas a layer 30n-1 (embedded in the guide 40) forms a conductive plane for the power domain Vcc2, each layer being adapted to electrically connect respective contact elements intended to carry a single specific power signal, Vcc1 respectively Vcc2. Furthermore, the other exposed face of the guide 40, in the example the face FB, is covered by a conductive layer 30a, which electrically connects the contact elements intended to carry another type of signal, in the example contact elements intended to carry ground signals. In this case as well, each conductive layer can be locally interrupted by suitable non-conductive zones 32, so as not to electrically connect contact elements that should not be short-circuited to each other, whose guide holes would be otherwise included in the conductive layer. In particular, the non-conductive zones 32 of a specific conductive layer are formed at the guide holes that house contact elements that should not be short-circuited by said specific conductive layer, whereas said specific layer at least partially covers the walls of the guide holes that house contact elements which should be short-circuited by said layer.

It is once again worth pointing out that, in its most general form, the testing head 20 comprises contact elements intended to carry ground and power signals, as well as contact elements intended to carry operating signals, namely in/out signals, that are housed in the guides in any combination, the conductive layers being suitably shaped so as to also short-circuit non-adjacent guide holes. Though not illustrated in FIGS. 4 and 6, it is thus obviously possible to provide for the presence of conductive layers adapted to electrically connect contact elements intended to carry operating signals, namely in/out signals between the device under test and the testing device.

Figure 7:
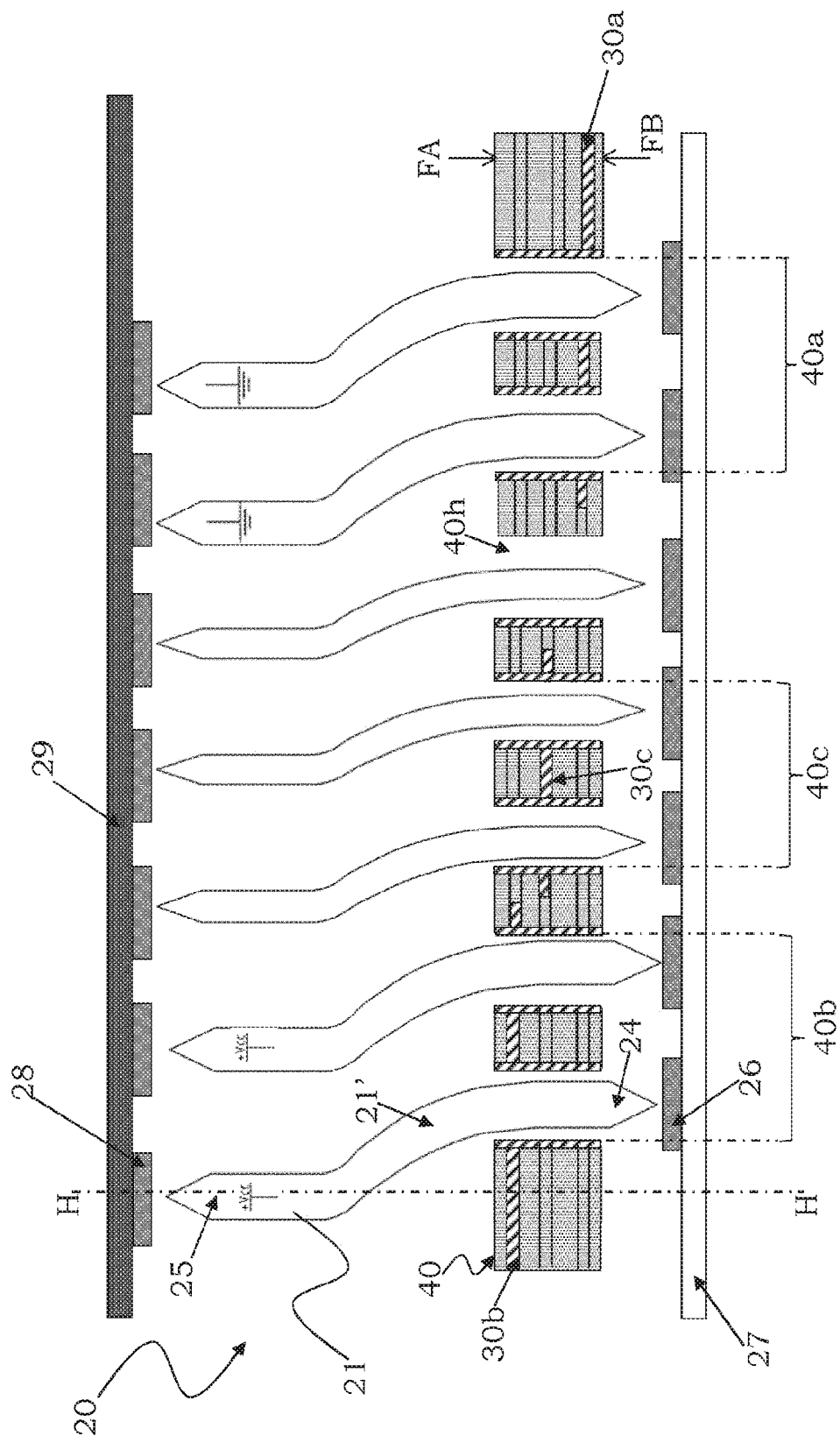
FIG. 7 schematically shows a testing head still according to another alternative embodiment of the present disclosure.

In this regard, referring to FIG. 7, an example is now illustrated in which the guide 40 of the testing head 20 comprises at least one first conductive layer 30a, one second conductive layer 30b and one third conductive layer 30c. In particular, the first conductive layer 30a includes a first group 40*a* of the guide holes 40*h* that houses contact elements adapted to carry ground signals, whereas the second conductive layer 30*b* includes a second group 40*b* of guide holes 40*h* that houses contact elements adapted to carry power signals. Furthermore, the third conductive layer 30*c* includes a third group 40*c* of guide holes 40*h* that houses contact elements adapted to carry operating signals, namely in/out signals, between the device under test and the testing apparatus.

In this way, the first conductive layer 30*a* electrically connects the contact elements adapted to carry ground signals being housed in the first group 40*a* of the guide holes 40*h*, the second conductive layer 30*b* electrically connects contact elements adapted to carry power signals being hosed in the second group 40*b* of guide holes 40*h* and the third conductive layer 30*c* electrically connects the contact elements adapted to carry operating signals being housed in the third group 40*c* of guide holes 40*h*.

It is possible to consider a case in which all of the contact elements that carry analogous signals, for instance ground signals, are electrically connected by means of the first conductive layer 30*a*, or a case in which just some of them are connected by said first conductive layer 30*a*. Likewise, it is possible to consider a case in which all of the contact elements that carry power signals are electrically connected by means of the second conductive layer 30*b*, or a case in which just some of them are connected by said second conductive layer.

In general, the testing head 20 according to the present disclosure can comprise a plurality of conductive layers, the number of which corresponds to the number of ground signals to carry, as well as a plurality of conductive layers, the number of which corresponds to the number of power signals to carry. Likewise, the testing head 20 can comprise a plurality of conductive layers, the number of which corresponds to the number of groups of contact pads of the device under test to short-circuit. Obviously, as previously shown, in case contact elements intended to carry a different type of signal are very close to each other, the conductive layers are locally interrupted by non-conductive zones, in particular at the guide holes housing contact elements not to short-circuit, namely the conductive layers do not emerge at the guide holes housing contact elements not to short-circuit.

Figure 8:
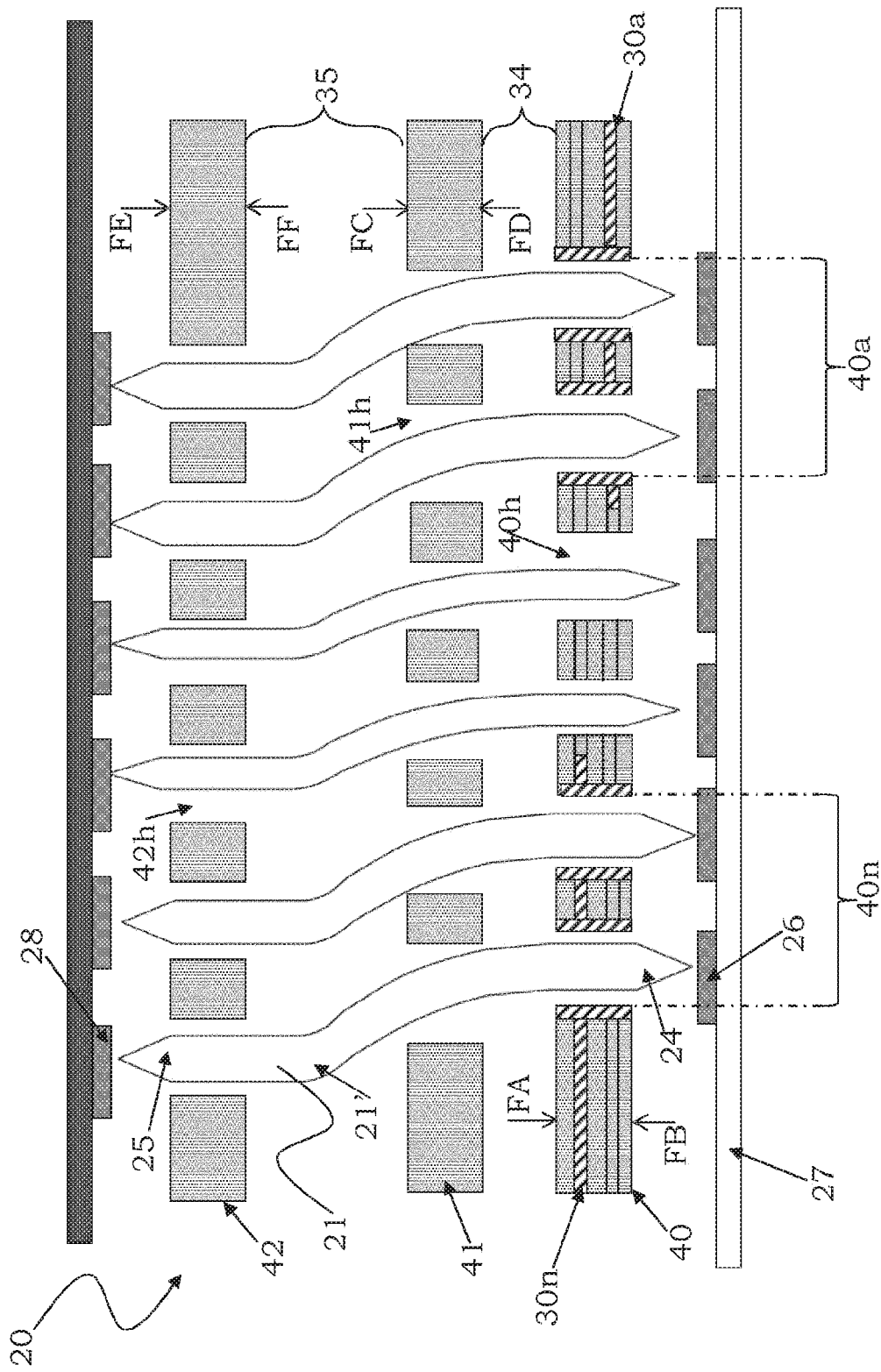
FIG. 8 schematically shows a testing head according to a further embodiment of the present disclosure.

Furthermore, according to an alternative embodiment illustrated in FIG. 8, the testing head 20 comprises at least one lower guide, still indicated with 40, at least one intermediate guide 41 and at least one upper guide 42. The lower guide 40 and the intermediate guide 41 are separated from each other by a suitable first air gap 34 whereas the first intermediate guide 41 and the upper guide 42 are separated from each other by a suitable second air gap 35. In such an embodiment, both the lower guide 40, the intermediate guide 41 and the upper guide 42 can comprise the plurality of conductive layers 30*a*-30*n*, or just one of them comprises said plurality of conductive layers 30*a*-30*n*. Each of the guides 40, 41, 42 comprises respective guide holes 40*h*, 41*h*, 42*h* for housing the contact elements 21.

It is pointed out that it is preferable to make the plurality of conductive layers 30*a*-30*n* in the lower guide 40 of the testing head 20, since in this way said plurality of conductive layers 30*a*-30*n* is closer to the device under test, thus improving the frequency filtering effects and reducing the length of the signal paths in loop back conditions. In other terms, it is preferable to make the conductive layers in the lower guide to improve the frequency performance of the testing head 20.

The conductive layers are made of a metal material selected for instance from copper (Cu), silver (Ag), gold (Au), palladium (Pd), rhodium (Rh) and alloys thereof.

Figure 9:
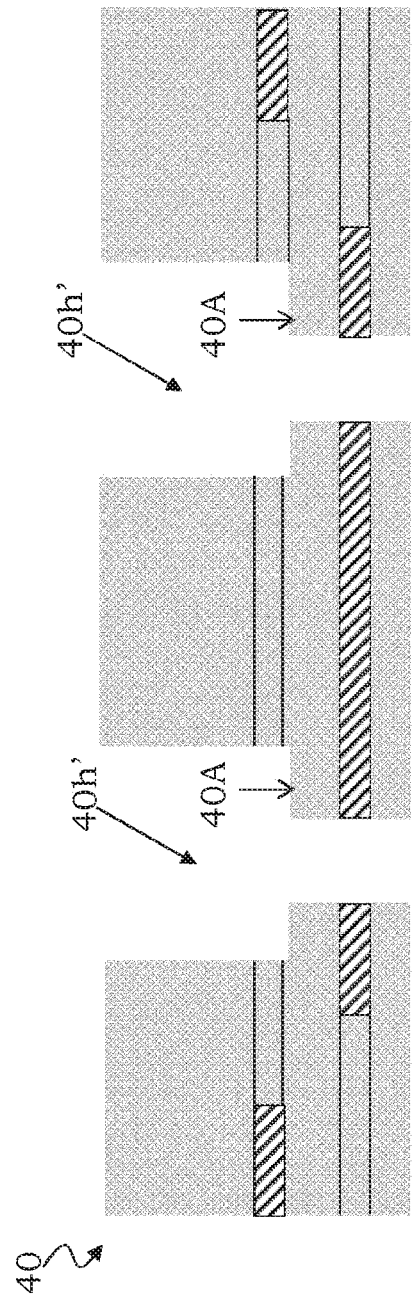
FIG. 9 schematically shows a guide of a testing head according to a further embodiment of the present disclosure.

As shown in FIG. 9, according to a preferred embodiment of the present disclosure, the guide 40 comprises a recessed portion 40A in correspondence of at least one guide hole 40*h*. It is pointed out that said recessed portion 40A is adapted to reduce the thickness of the guide hole at which it is formed and thus it is adapted to reduce the friction problems of the contact elements inside said guide hole, in particular in case of testing of fine pitch devices. As a result, the embodiment of FIG. 9 is particularly advantageous for testing fine pitch devices, since the frictions are reduced and consequently the interlocking problems of the contact elements in the guide holes.

Obviously, inside a same guide, it is possible to provide for guide holes 40*h*' provided with the recessed portion 40A and for guide holes 40*h* not provided with the recessed portion 40A.

It is pointed out that the recessed portions 40A can be made by lowering one or more layers of the guide 40 or by overlapping layers having openings having different diameters. It is further pointed out that the presence of the recessed portion 40A does not prevent the sliding contact between the contact elements and the walls of the metallized holes from occurring. Furthermore, instead of a ceramic multilayer MLC, the guide 40 can comprise an organic multilayer (MLO, acronym from English "MultiLayer Organic") that is associated with a rigid support, for instance glued to it, said MLO including a plurality of organic material layers that form a plurality of non-conductive layers, on said layers one or more conductive layers being arranged, analogously to what has been previously described. Said rigid support is preferably a ceramic support.

The use of an MLO allows forming the recessed portions 40A in case the MLO comprises openings having a diameter different from corresponding openings formed in the rigid support, so that when said openings are concentrically overlapped, they form the guide holes 40*h*' of the guide 40, which are provided with the previously mentioned recessed portion 40A.

The use of an MLO, or in general of a softer and more flexible multilayer associated with a rigid support, facilitates the process of making the guide 40.

Figure 10:
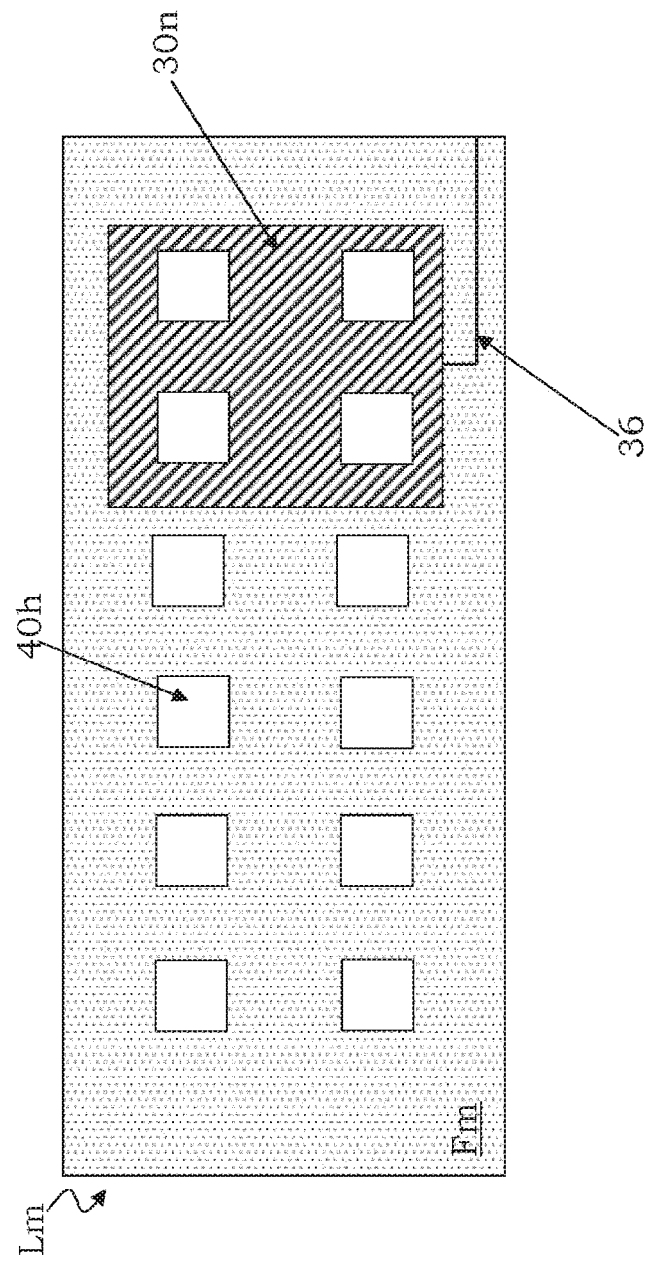
FIG. 10 schematically shows a view from above of a layer of a guide according to an alternative embodiment of the present disclosure.

Furthermore, according to a further embodiment of the present disclosure represented in FIG. 10, the guide 40, comprising the plurality of conductive layers 30*a*-30*n*, comprises at least one conductive track 36 formed in at least one of the non-conductive layers La-Lm (the layer Lm in the example of FIG. 10) and connected to the respective conductive layer (the layer 30*n* in FIG. 10), said conductive track 36 extending on the face of the layer whereon it is formed. In this way, the conductive track 36 extracts the corresponding signal of the conductive layer and carry it outside the guide, for instance on a common pad formed on one of the exposed faces of the guide 40. The conductive track 36 can thus carry a ground signal, a power signal or an in/out signal, for instance towards the PCB for detecting the same or for any other application.

In this regard, it is also possible to provide, on a non-conductive layer La-Lm of the guide 40, for at least one conductive portion that includes and metallizes a single guide hole 40*h* which is intended to house a contact element that preferably carries in/out signals. In this way, it is possible to carry an in/out signal by means of a further conductive track for instance towards a PCB board or towards a further external pad. It is also possible to provide for the presence of a plurality of conductive portions, separated from each other, each performing the metallization of a respective single guide hole 40h, which are possibly connected to each other by means of conductive tracks and/or by means of a circuital component if required by the circumstances.

Figure 11:
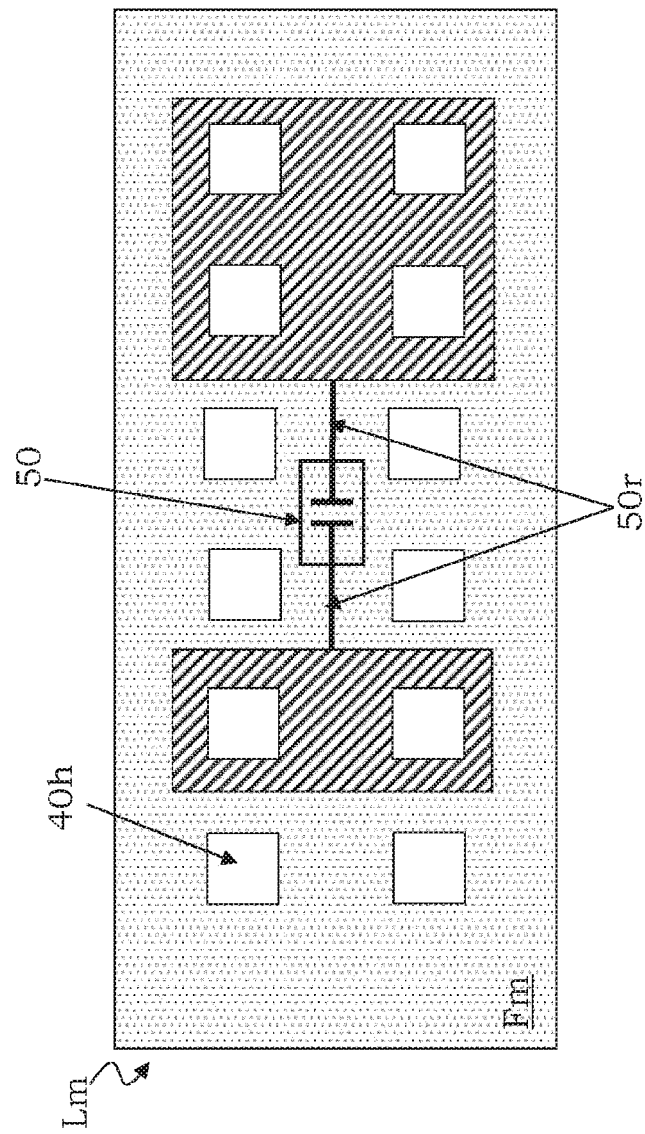
FIG. 11 schematically shows a view from above of a layer of a guide according to a further alternative embodiment of the present disclosure.

Finally, according to the embodiment illustrated in FIG. 11, at least one layer of the guide 40, which comprises at least one conductive layer, also comprises at least one circuital component 50 connected to said conductive layer, which forms a common conductive plane. As illustrated in the example of FIG. 11, a layer of the guide 40 (the layer Lm in the Figure) comprises at least two conductive layers and the circuital component 50 is electrically connected thereto. By way of example, the circuital component 50 is a filtering capacitor, still indicated with reference number 50, having the rheophores 50r connected to respective conductive layers. It is pointed out that said capacitor 50 can connect to each other conductive layers intended to short-circuit contact elements intended to carry ground signals, power signals or in/out signals. Suitably, such an embodiment allows maximizing the filtering effect of the capacitors 50, and thus minimizing interference caused by the contact elements that carry the ground and power signals, as well as optimizing the loop-back technique, since said filtering capacitors 50 are thus positioned as close as possible to the contact tips of the contact elements (namely on the lower guide 40), i.e. close to the wafer 27. Said capacitor can be housed in suitable housing seats formed in the layers La-Lm of the guide 40.

Obviously, nothing prevents from providing a configuration in which the capacitor 50 has a first rheophore connected to a conductive layer that includes a plurality of guide holes and the other rheophore connected to a conductive portion that includes and metallizes a single guide hole.

It is pointed out that the circuital component 50, which, as mentioned, is preferably a filtering capacitor, can also be any other circuital component suitable for specific needs, such as for instance an inductor or a resistor or even a relay.

In conclusion, the present disclosure provides for making a testing head wherein at least one guide comprises a plurality of conductive layers, each of which includes guide holes and electrically connects contact elements that carry a same type of signal and are housed in the guide holes.

Advantageously according to the present disclosure, contact elements that carry ground signals are electrically connected in the testing head by one or more conductive layers, which allows greatly reducing, if not totally eliminating, the noise in the signal generated by the different grounds, since said conductive layer forms a ground plane common to all of the ground contact elements.

Likewise, the electric connection between contact elements that carry the power signals also contributes reducing the interference and thus the noise in the testing head. In this way, by means of the present disclosure, it is possible to also reduce the common-mode noise.

As a result, the present disclosure allows improving the frequency performance of the testing head as a whole.

Furthermore, the electric connection between contact elements that carry operating signals, namely in/out signals, preferably at the lower guide, also allows increasing the frequency performance of the testing head should there be the need for electrically connecting two or more contact pads of the device under test as under the loop back conditions.

Suitably, it is in fact possible to short-circuit groups of probes (and therefore of corresponding pads of the device) to each other without necessarily carrying the respective signal to the testing apparatus, said short-circuit being advantageously realized by means of a conductive layer formed at the lower and/or intermediate guide, namely close to the device under test, thus improving the electric performance of the short-circuit so obtained.

It should also be added that the possibility of short-circuiting the ground and power contact elements allows improving the current performance of the testing head of the present disclosure, further avoiding any burns of said contact elements.

According to the present disclosure, making a plurality of conducive layers further allows making a testing head intended to carry a plurality of different power signals, since it is possible to make a plurality of conductive planes, one for each power domain by means of corresponding layers of the plurality of conductive layers. This aspect can obviously be also generalized to the ground contact elements and operating signals, namely in/out signals, for instance in case it is necessary to short-circuit more than one groups of contact pads of the device under test.

Suitably, each conductive layer is shaped so as to have non-conductive zones that avoid the electric connection between contact elements that do not need to be short-circuited.

Finally, it is pointed out that, advantageously according to the present disclosure, it is possible to obtain a testing head with improved performance in terms of signal filtering, thanks to the presence of suitable capacitors that are electrically connected to the conductive layers.

From the foregoing it will be appreciated that, although specific embodiments of the disclosure have been described herein for purposes of illustration, various modifications may be made without deviating from the spirit and scope of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A testing head comprising:
at least one guide provided with a plurality of guide holes, the plurality of guide holes including a plurality of groups of guide holes, and
a plurality of contact elements housed in the plurality of guide holes, the plurality of contact elements including a plurality of groups of contact elements, wherein the at least one guide comprises a plurality of conductive layers, each conductive layer:
including holes of a corresponding group of the plurality of groups of guide holes, and
electrically connecting a corresponding group of contact elements, of the groups of contact elements, housed in the guide holes of the corresponding group of guide holes, the contact elements of the corresponding group of contact elements being adapted to carry a same type of signal, wherein:
the at least one guide is a multilayer comprising a plurality of non-conductive layers, and
the conductive layers are arranged on respective faces of a layer of the plurality of non-conductive layers, wherein the non-conductive layers are arranged one upon the other and form the at least one multilayer guide, each conductive layer being separated from an adjacent conductive layer by one of the non-conductive layers, and wherein the at least one guide including the conductive layers is a lower guide or an intermediate guide of the testing head.

2. The testing head of claim 1, wherein the at least one guide is a ceramic multilayer comprising a plurality of non-conductive layers made of a ceramic material.

3. The testing head of claim 1, wherein the at least one guide comprises an organic multilayer associated with a rigid support,
the organic multilayer including a plurality of layers made of an organic material,
the organic material layers forming non-conductive layers on which at least one conductive layer of said the plurality of conductive layers is arranged.

4. The testing head of claim 1, wherein each of the conductive layers have a lower area than an area of the face.

5. The testing head of claim 1, wherein each of the conductive layers electrically connects contact elements housed therein, except contact elements housed in guide holes not belonging to the group.

6. The testing head of claim 1, wherein the conductive layers also comprise surface layers made on at least one exposed face of the at least one guide.

7. The testing head of claim 1, wherein the plurality of conductive layers are embedded in the at least one guide.

8. The testing head of claim 1, wherein:
the plurality of conductive layers includes at least one first conductive layer and at least one second conductive layer,
the at least one first conductive layer includes holes of a first group of the plurality of groups of guide holes and electrically connects a first group of contact elements housed in the first group of guide holes, the first group of contact elements being adapted to carry ground signals, and
the at least one second conductive layer includes holes of a second group of the plurality of groups of guide holes and electrically connects a second group of contact elements housed in the second group of guide holes, the second group of contact elements being adapted to carry power signals.

9. The testing head of claim 8, wherein the at least one first conductive layer includes a plurality of first conductive layers, equal in number with the number of power signals to carry.

10. The testing head of claim 8, wherein the at least one second conductive layer includes a plurality of second conductive layers, equal in number with the number of ground signals to carry.

11. The testing head of claim 8, further comprising at least one third conductive layer including the holes of a third group of the plurality of guide holes and electrically connecting a third group of contact elements housed in the third group of the plurality of guide holes, the third group of contact elements being adapted to carry operating signals for a device under test.

12. The testing head of claim 10, wherein the at least one third conductive layer includes a plurality of third conductive layers, equal in number with the number of groups of contact pads that should be short-circuited of a device under test.

13. The testing head of claim 1, wherein at least one of the conductive layers is separated from other conductive layers.

14. The testing head of claim 1, wherein at least one of the conductive layers is locally interrupted by at least one non-conductive zone.

15. The testing head of claim 12, wherein the at least one guide comprises at least one coating dielectric portion that covers the at least one non-conductive zone.

16. The testing head of claim 1, wherein the at least one guide includes a lower guide, an intermediate guide, and an upper guide, the lower guide and the intermediate guide being separated from each other by a first gap and the intermediate guide and the upper guide being separated from each other by a second gap, each of the guides comprising respective guide holes for housing the contact elements.

17. The testing head of claim 16, wherein one or more of the guides comprise the plurality of conductive layers.

18. The testing head of claim 16, wherein the lower guide comprises the plurality of conductive layers.

19. The testing head of claim 1, wherein each layer of the plurality of conductive layers covers at least one portion of an inner surface of each guide hole of the group of guide holes.

20. The testing head of claim 1, wherein at least one portion of a wall of each of the guide holes of the at least one guide comprises a metallization.

21. The testing head of claim 1, wherein the at least one guide comprises at least one conductive track connected to a conductive layer of the plurality of conductive layers for extracting a signal carried by the contact elements that are electrically connected to each other by the conductive layer.

22. The testing head of claim 1, wherein said at least one guide comprises a recessed portion in correspondence of at least one guide hole.

23. The testing head of claim 1, further comprising at least one circuit component electrically connected to at least one layer of the plurality of conductive layers of the at least one guide.

24. The testing head of claim 23, wherein the at least one circuit component is a capacitor.

25. The testing head of claim 1, wherein said at least one guide comprises at least one conductive portion that surrounds one of the guide holes configured to house a single contact element, the at least one guide comprising a conductive track that extracts a signal from the at least one conductive portion.

26. The testing head of claim 1, wherein said at least one guide comprises at least one conductive portion that surrounds one of the guide holes configured to house a single contact element, the at least one guide comprising a conductive track that connects said at least one conductive portion to further conductive portions or to a layer of the plurality of conductive layers.

27. A testing head comprising:
at least one guide provided with a plurality of guide holes, the plurality of guide holes including a plurality of groups of guide holes, and a plurality of contact elements housed in the plurality of guide holes, the plurality of contact elements including a plurality of groups of contact elements, wherein: the at least one guide comprises a plurality of conductive layers, each conductive layer:
including holes of a corresponding group of the plurality of groups of guide holes, and electrically connecting a corresponding group of contact elements, of the groups of contact elements, housed in the guide holes of the corresponding group of guide holes, the contact elements of the corresponding group of contact elements being adapted to carry a same type of signal, the at least one guide is a ceramic multilayer comprising a plurality of non-conductive layers made of a ceramic material, and the conductive layers are arranged on respective faces of a layer of the plurality of non-conductive layers, wherein the non-conductive layers are arranged one upon the other and form the at least one multilayer guide, each conductive layer being separated from an adjacent conductive layer by one of the non-conductive layers, and wherein the at least one guide including the conductive layers is a lower guide or an intermediate guide of the testing head.

28. A testing head comprising:

at least one guide provided with a plurality of guide holes, the plurality of guide holes including a plurality of groups of guide holes, and a plurality of contact elements housed in the plurality of guide holes, the plurality of contact elements including a plurality of groups of contact elements, wherein:

the at least one guide comprises a plurality of conductive layers, each conductive layer: including holes of a corresponding group of the plurality of groups of guide holes and electrically connecting a corresponding group of contact elements, of the groups of contact elements, housed in the guide holes of the corresponding group of guide holes, the contact elements of the corresponding group of contact elements being adapted to carry a same type of signal, and the conductive layers are arranged on respective faces of a layer of the plurality of non-conductive layers, the at least one guide comprises an organic multilayer associated with a rigid support, the organic multilayer includes a plurality of layers made of an organic material, the organic material layers form non-conductive layers on which at least one conductive layer of said the plurality of conductive layers is arranged, wherein the non-conductive layers are arranged one upon the other and form the at least one multilayer guide, each conductive layer being separated from an adjacent conductive layer by one of the non-conductive layers, and wherein the at least one guide including the conductive layers is a lower guide or an intermediate guide of the testing head.

\* \* \* \* \*